(12) United States Patent
Yon

(10) Patent No.: US 9,030,861 B2
(45) Date of Patent: May 12, 2015

(54) VARIABLE RESISTANCE MEMORY DEVICE AND OPERATING METHOD THEREOF

(71) Applicant: SK Hynix Inc., Icheon-si, Gyeonggi-do (KR)

(72) Inventor: Sun Hyuck Yon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 233 days.

(21) Appl. No.: 13/720,911

(22) Filed: Dec. 19, 2012

(65) Prior Publication Data

US 2014/0063904 A1 Mar. 6, 2014

(30) Foreign Application Priority Data

Aug. 29, 2012 (KR) ........................ 10-2012-0094864

(51) Int. Cl.
*G11C 13/00* (2006.01)
*G11C 7/16* (2006.01)

(52) U.S. Cl.
CPC ................ *G11C 13/004* (2013.01); *G11C 7/16* (2013.01); *G11C 13/0004* (2013.01); *G11C 2013/0054* (2013.01); *G11C 2213/72* (2013.01); *G11C 2213/79* (2013.01)

(58) Field of Classification Search
CPC ............ G11C 7/14; G11C 7/06; G11C 7/062; G11C 13/004; G11C 7/16

USPC .............. 365/171, 201, 158, 189, 148, 210.1, 365/189.15

See application file for complete search history.

(56) References Cited

U.S. PATENT DOCUMENTS

| | | | |
|---|---|---|---|
| 7,643,336 B2* | 1/2010 | Kang et al. .................... | 365/163 |
| 8,098,513 B2* | 1/2012 | Liu et al. ....................... | 365/148 |
| 8,406,072 B2* | 3/2013 | Kim et al. ...................... | 365/201 |
| 8,654,595 B2* | 2/2014 | Kim et al. ................ | 365/189.15 |
| 2003/0016566 A1* | 1/2003 | Yamaki et al. ........... | 365/189.09 |
| 2011/0194330 A1* | 8/2011 | Liu et al. ....................... | 365/148 |
| 2012/0044755 A1* | 2/2012 | Kim et al. ...................... | 365/171 |
| 2013/0064008 A1* | 3/2013 | Kim et al. ...................... | 365/158 |
| 2014/0192588 A1* | 7/2014 | Lee et al. ....................... | 365/148 |

FOREIGN PATENT DOCUMENTS

| | | |
|---|---|---|
| KR | 100801082 B1 | 1/2008 |
| KR | 1020110044535 A | 4/2011 |

* cited by examiner

*Primary Examiner* — Son Dinh
*Assistant Examiner* — Jerome Leboeuf
(74) *Attorney, Agent, or Firm* — William Park & Associates Ltd.

(57) ABSTRACT

An operating method of a variable resistance memory device including a pre-read step which may include the steps of: reading a first reference cell using a first reference voltage; reading a second reference cell using a second reference voltage; and setting a third reference voltage based on the first and second reference voltages; and a main read step of reading a selected memory cell using the third reference voltage.

20 Claims, 13 Drawing Sheets

VARIABLE RESISTANCE MEMORY DEVICE AND OPERATING METHOD THEREOF

CROSS-REFERENCES TO RELATED APPLICATION

The present application claims priority under 35 U.S.C. §119(a) to Korean application number 10-2012-0094864, filed on Aug. 29, 2012, in the Korean Intellectual Property Office, which is incorporated herein by reference in its entirety.

BACKGROUND

1. Technical Field

The present invention generally relates to a semiconductor memory device, and more particularly, to a variable resistance memory device and an operating method thereof.

2. Related Art

In general, a semiconductor memory device is classified into a volatile memory device and a nonvolatile memory device. The volatile memory device loses data stored therein when power supply is cut off, but the nonvolatile memory device maintains data stored therein even though power supply is cut off. The nonvolatile memory device may include various types of memory cells.

The nonvolatile memory device may be divided into a flash memory device, a ferroelectric RAM (FRAM) using a ferroelectric capacitor, a magnetic RAM (MRAM) using a tunneling magneto-resistive (TMR) layer, a phase change memory device using chalcogenide alloys and the like, depending on the structure of memory cells. In particular, the phase change memory device is a nonvolatile memory device using phase change based on temperature change, that is, resistance change. For this reason, the phase change memory device is also referred to as a variable resistance memory device.

The phase change memory device includes memory cells formed of a phase change material, for example, a chalcogenide alloy which is a germanium(Ge)-antimony(Sb)-tellurium(Te) mixture (GST) (hereafter, referred to as a GST material). The GST material has an amorphous state having a relatively high resistivity and a crystalline state having a relatively low resistivity. The memory cell of the phase change memory device may store data '0' corresponding to the amorphous state and data '1' corresponding to the crystalline state. The GST material may be heated to program the data corresponding to the amorphous state or the crystalline state into the memory cell of the phase change memory device. For example, the amorphous state or the crystalline state of the GST material may be controlled by adjusting the magnitude of a current for heating the GST material and the application time of the current.

However, as the time elapses after the program operation, resistance drift may occur in the GST material forming the memory cell of the phase change memory device. When the resistance drift occurs, the resistance value of the GST material does not maintain a fixed value, but increases. The resistance change of the GST material may reduce a sensing margin of the memory cell, thereby reducing the reliability of the phase change memory device.

SUMMARY

A variable resistance memory device of which the reliability is improved and an operating method thereof are described herein.

In an embodiment, an operating method of a variable resistance memory device includes: a pre-read step including the steps of: reading a first reference cell using a first reference voltage; reading a second reference cell using a second reference voltage; and setting a third reference voltage based on the first and second reference voltages; and a main read step of reading a selected memory cell using the third reference voltage.

In an embodiment, a variable resistance memory device includes: a memory cell arranged at a region where a word line and a bit line cross each other; a first reference cell and a second reference cell connected to the word line; a reference sense amplifier configured to perform a read operation for the first and second reference cells, and generate a third reference voltage generation code based on a first reference voltage used for the read operation for the first reference cell and a second reference voltage used for the read operation for the second reference cell; and a main sense amplifier configured to select a third reference voltage according to the third reference voltage generation code, and perform a read operation for the memory cell using the selected third reference voltage.

BRIEF DESCRIPTION OF THE DRAWINGS

Features, aspects, and embodiments are described in conjunction with the attached drawings, in which.

DETAILED DESCRIPTION

Hereinafter, a variable resistance memory device and an operating method thereof according to various embodiments will be described below with reference to the accompanying drawings through the various embodiments.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
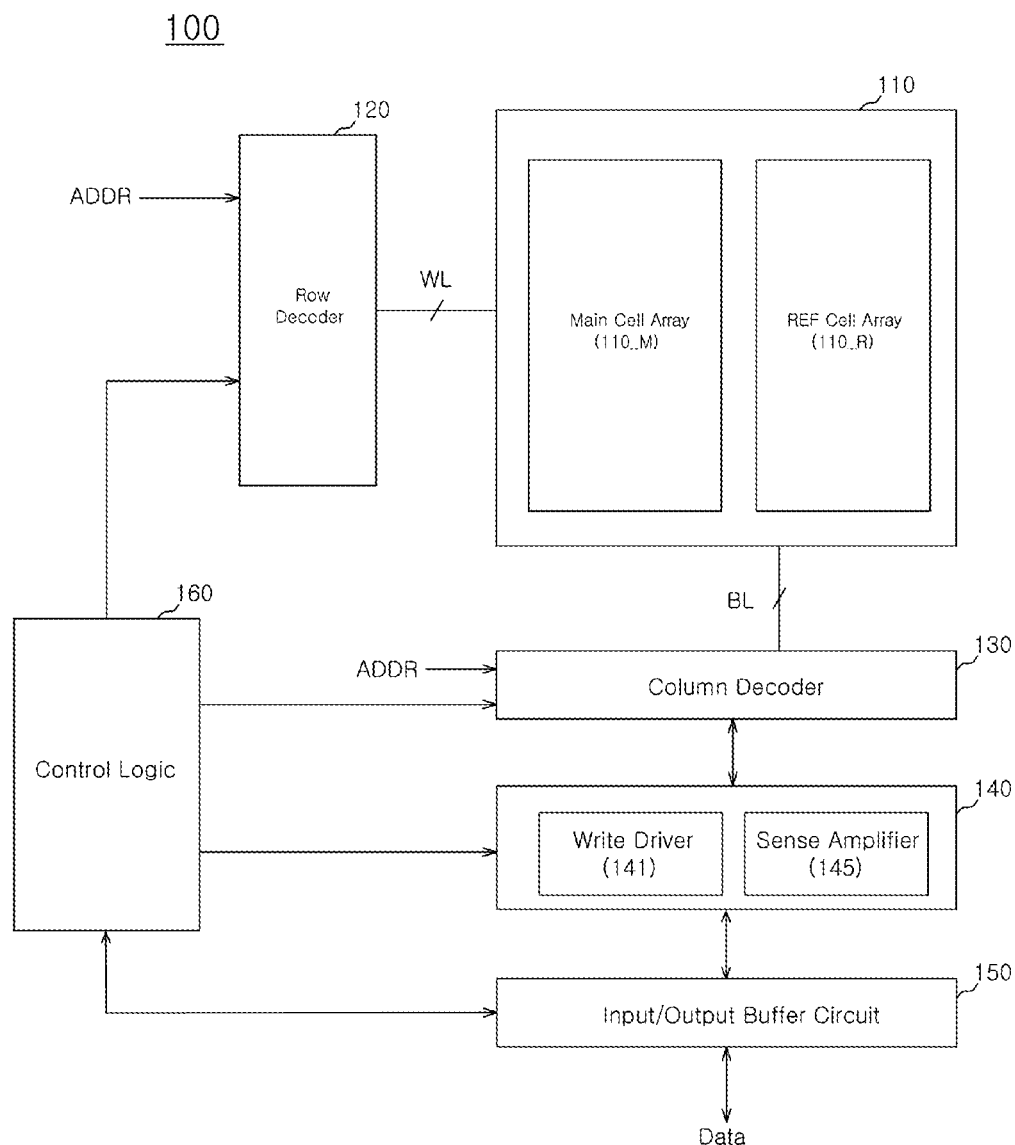
FIG. 1 is a block diagram illustrating a variable resistance memory device according to an embodiment.

FIG. 1 is a block diagram illustrating a variable resistance memory device according to an embodiment. For example, the variable resistance memory device or generally the nonvolatile memory device 100 may include a phase change memory device using resistance change based on temperature change, that is, phase change.

Referring to FIG. 1, the nonvolatile memory device 100 may include a memory cell array 110, a row decoder 120, a column decoder 130, a data read/write circuit 140, an input/output buffer circuit 150, and a control logic 160.

The memory cell array 110 may include a main cell array 110_M and a reference cell array 110_R. The main cell array 110_M may include memory cells for storing data provided from an external device (not illustrated). The reference cell array 110_R may include reference cells for performing a read operation while minimizing a resistance drift effect. The main cell array 110_M and the reference cell array 110_R will be described with reference to FIG. 7.

The row decoder 120 may be operated according to the control of the control logic 160. The row decoder 120 may be connected to the memory cell array 110 through a plurality of word lines WL. The row decoder 120 may be configured to decode an address ADDR inputted from outside. The row decoder 120 may provide a select voltage to a selected word line, and provide an unselect voltage to an unselected word line according to the decoding result.

The column decoder 130 may be operated according to the control of the control logic 160. The column decoder 130 may be connected to the memory cell array 110 through a plurality of bit lines BL. The column decoder 130 may be configured to decode the address ADDR. The column decoder 130 may be configured to electrically connect the bit lines BL to the data read/write circuit 140 according to the decoding result.

The data read/write circuit 140 may be operated according to the control of the control logic 160. The data read/write circuit 140 may include a write driver 141 and a sense amplifier 145.

The write driver 141 may be configured to perform a write operation on the memory cells included in the memory cell array 110. The write driver 141 may be configured to provide a write current to a bit line BL during a write operation. For example, the write driver 141 may provide a current for writing (or programming) data '1' or '0' to a selected memory cell MC.

The sense amplifier 145 may be configured to perform a read operation on the memory cells included in the memory cell array 110. The sense amplifier 145 may be configured to read data stored in a selected memory cell during a read operation or verify read operation. The sense amplifier 145 may sense a difference between a reference voltage and the voltage of a sensing node formed according to the state of the selected memory cell. Furthermore, the sense amplifier 145 may determine the data stored in the memory cell from the sensing result. The sense amplifier 145 may be configured to sense states of the reference cells and control the reference voltage according to the sensing result. This operation will be described in detail.

The input/output buffer circuit 150 may be configured to receive data from an external device (for example, a memory controller, a memory interface, a host device, a test device, or the like) or output data to the external device. For this operation, the input/output output buffer circuit 150 may include a data latch circuit (not illustrated) and an output driving circuit (not illustrated).

The control logic 160 may be configured to control overall operations of the phase change memory device 100 in response to a command provided from the external device. For example, the control logic 160 may control read, program (or write), and erase operations of the phase change memory device 100. Furthermore, when the variable resistance memory device 100 is configured with a phase change memory device, the erase operation may indicate an operation of programming a memory cell to the amorphous state.

The control logic 160 may be configured to control a reference cell program operation and a pre-read operation, in order to perform a read operation or verify read operation while minimizing a resistance drift occurring in the main cell array 110_M. The control logic 160 performs a reference cell program operation and a pre-read operation through the write driver 141 and the sense amplifier 145. The reference cell program operation and the pre-read operation will be described in detail with reference to a flow chart below.

Figure 2:
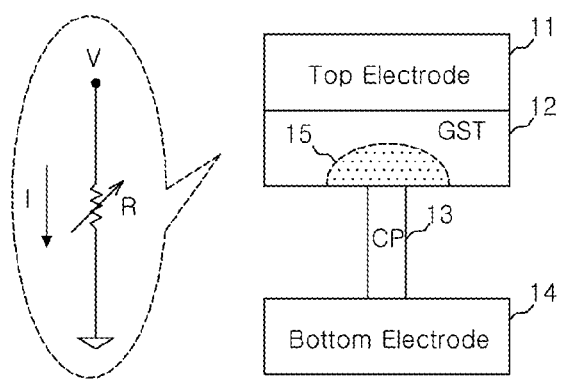
FIG. 2 is a diagram for explaining a memory element of a memory cell included in a memory cell array of FIG. 1.

FIG. 2 is a diagram for explaining a memory element of a memory cell included in the memory cell array of FIG. 1 (where V=voltage and R=resistance). The memory cell of the variable resistance memory device 100 of FIG. 1 may include a memory element and a selecting element. FIG. 2 briefly illustrates the memory element of the memory cell.

The memory element 16 may have a variable resistance value depending on an applied current I. Therefore, the memory element 16 may be referred to as a resistor element. Referring to FIG. 2 illustrating the cross-section of the memory element 16, the memory element 16 may include a top electrode 11, a GST material 12, a contact plug (CP) 13, and a bottom electrode 14.

The top electrode 11 may be connected to a bit line BL. The bottom electrode 14 may be connected between the CP 13 and a selecting element (not illustrated). The CP 13 is formed of a conductive material (for example, TiN). The CP 13 is referred to as a heater plug. The GST material 12 is formed between the top electrode 11 and the CP 13.

The phase of the GST material 12 may change depending on the magnitude of a supplied current and the time at which the current is supplied. As illustrated in FIG. 2, the phase of the GST material corresponding to a reset state or set state may be decided by an amorphous volume 15. As the phase changes from the amorphous state to the crystalline state, the amorphous volume 15 decreases. The amorphous state corresponds to the reset state, and the crystalline state corresponds to the set state. The GST material 12 has a resistance value which is varied according to the amorphous volume 15. That is, data to be written into the memory cell is decided by the amorphous volume 15 of the GST material 12, which is formed according to an applied current.

Figure 3:
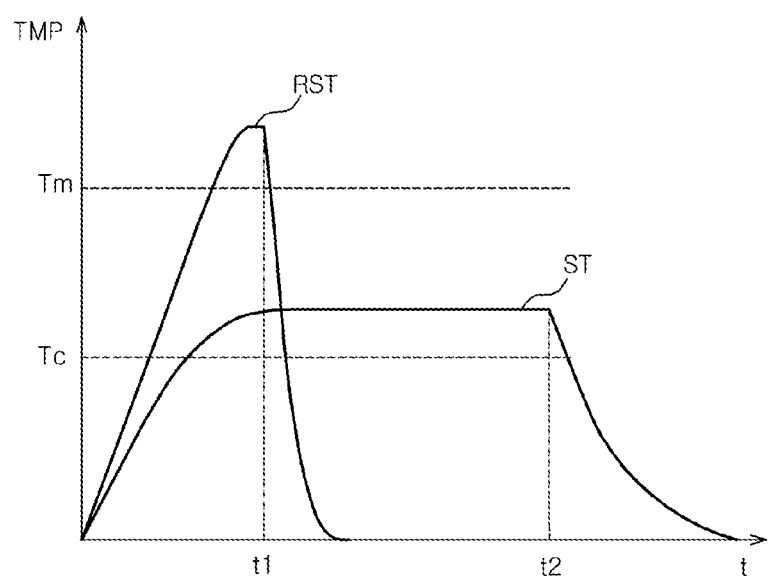
FIG. 3 is a graph for explaining the characteristics of a GST material illustrated in FIG. 2.
Figure 4:
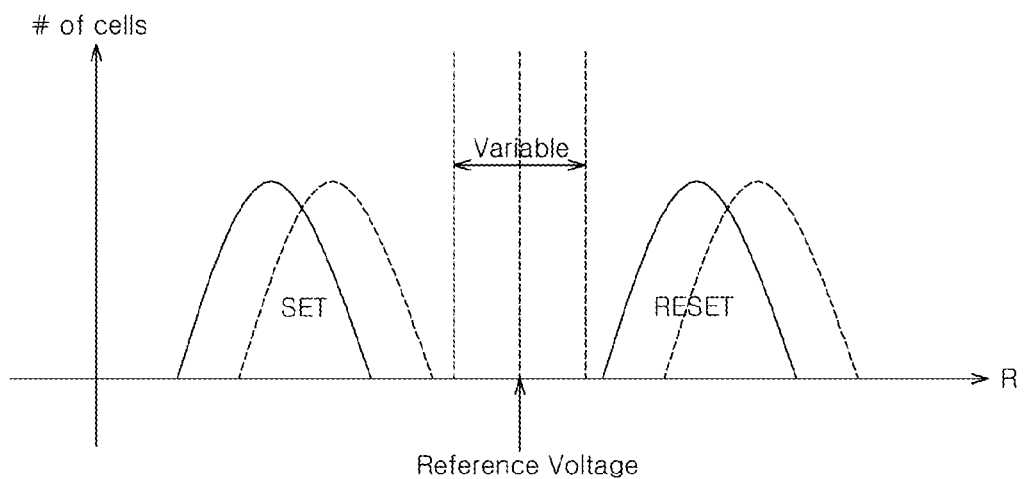
FIG. 4 is a diagram illustrating resistance distributions of a memory cell based on the state of the GST material.

FIG. 3 is a graph for explaining the characteristics of the GST material illustrated in FIG. 2. FIG. 4 is a diagram illustrating resistance distributions of the memory cell based on the state of the GST material.

In FIG. 3, RST represents a condition for changing the GST material into the amorphous state (that is, reset state). The GST material changes to the amorphous state when the GST material is heated at a higher temperature (i.e., y-axis displays temperature TMP and the x-axis displays time t) than a melting temperature Tm during a time t1 and then rapidly quenched. The amorphous state has a relatively high resistance value. For example, when the GST material changes to the amorphous state, the memory cell 10 of FIG. 1 may store data '0'.

Furthermore, ST represents a condition for changing the GST material into the crystalline state (that is, set state). The GST material changes to the crystalline state when the GST material is heated at a higher temperature than a crystallization temperature Tc during a time t2 longer than the time t1 and then slowly quenched. The crystallization temperature Tc is lower than the melting temperature Tm. The crystalline state has a relatively low resistance value. For example, when the GST material changes to the crystalline state, the memory cell 10 may store data '1'.

FIG. 4 illustrates that the memory cell has two resistance distributions. However, when the state of the GST material is controlled in various manners, the memory cell may have a plurality of resistance distributions. That is, the memory cell may include a multi-level cell capable of storing a plurality of bits per cell according to the state of the GST material.

In order to determine data stored in the memory cell, that is, in order to determine the resistance distributions of the memory cell, a reference voltage is used. For example, when the voltage of a sensing node formed according to the state of the memory cell is smaller than the reference voltage, the sense amplifier 145 of FIG. 1 determines that the memory cell is in the set state (i.e., SET). As another example, when the voltage of the sensing node formed according to the state of the memory cell is larger than the reference voltage, the sense amplifier 145 determines that the memory cell is in the reset state (i.e., RESET).

When the reference voltage is properly varied (i.e., Variable), it is possible to secure a sensing margin even though the resistance distributions of the memory cell is changed by a resistance drift effect as indicated by dotted lines of FIG. 4 (i.e., y-axis displays the number of cells, # of cells, and the x-axis displays resistance R).

Figure 5:
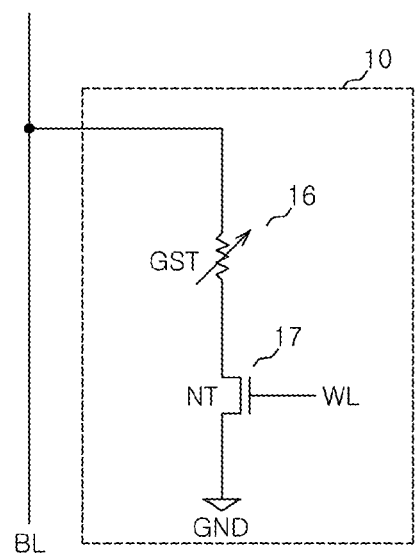
FIGS. 5 and 6 are circuit diagrams illustrating a memory cell included in the memory cell array of FIG. 1.
Figure 6:
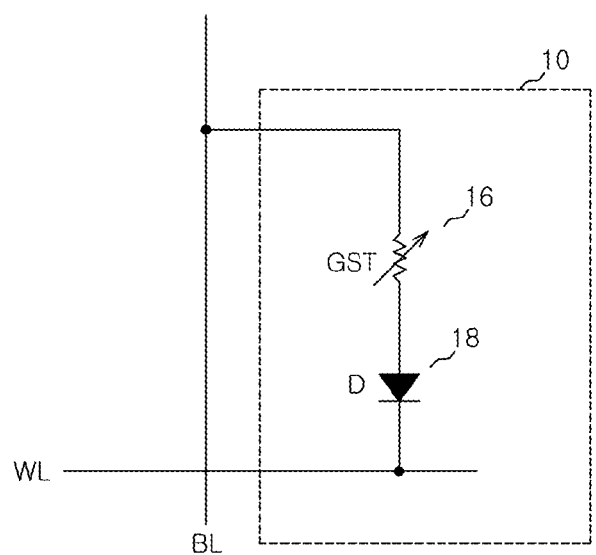

FIGS. 5 and 6 are circuit diagrams illustrating a memory cell included in the memory cell array of FIG. 1. FIG. 5 illustrates a phase change memory cell including a MOS switch-type selecting element, and FIG. 6 illustrates a phase change memory cell including a diode switch-type selecting element.

Referring to FIG. 5, the memory cell 10 may include a memory element 16 and a selecting element 17. The memory element 16 may be connected between a bit line BL and the selecting element 17. The selecting element 17 may be connected between the memory element 16 and the ground GND. The selecting element 17 has a gate connected to a word line WL. FIG. 5 illustrates that the memory element 16 may be connected between the bit line BL and the selecting element 17, but the selecting element 17 may be connected between the bit line BL and the memory element 16.

The memory element 16 has the same configuration (i.e., GST) and performs the same operation as the memory element illustrated in FIG. 2. Therefore, the detailed descriptions thereof will be omitted herein.

The selecting element 17 may include an NMOS transistor NT. When a predetermined voltage is applied to the word line WL to select the memory cell 10, the NMOS transistor NT is turned on. When the NMOS transistor NT is turned on, the memory element 16 receives a current through the bit line BL.

Referring to FIG. 6, the memory cell 10 may include a memory element 16 and a selecting element 18. The memory element 16 may be connected between the bit line BL and the selecting element 18. The selecting element 18 may be connected between the memory element 16 and the word line WL.

The memory element 16 has the same configuration (i.e., GST) and performs the same operation as the memory element illustrated in FIG. 2. Therefore, the detailed descriptions thereof will be omitted herein.

The selecting element 18 may include a diode D. The diode D has an anode connected to the memory element 16 and a cathode connected to the word line WL. When a ground voltage GND (not shown) is applied to the word line WL to select the memory cell 10, a voltage difference between the anode and the cathode of the diode D is changed. When the voltage difference between the anode and the cathode of the diode D becomes higher than the threshold voltage of the diode D, the diode D is turned on. When the diode D is turned on, the memory element 16 receives a current through the bit line BL.

Figure 7:
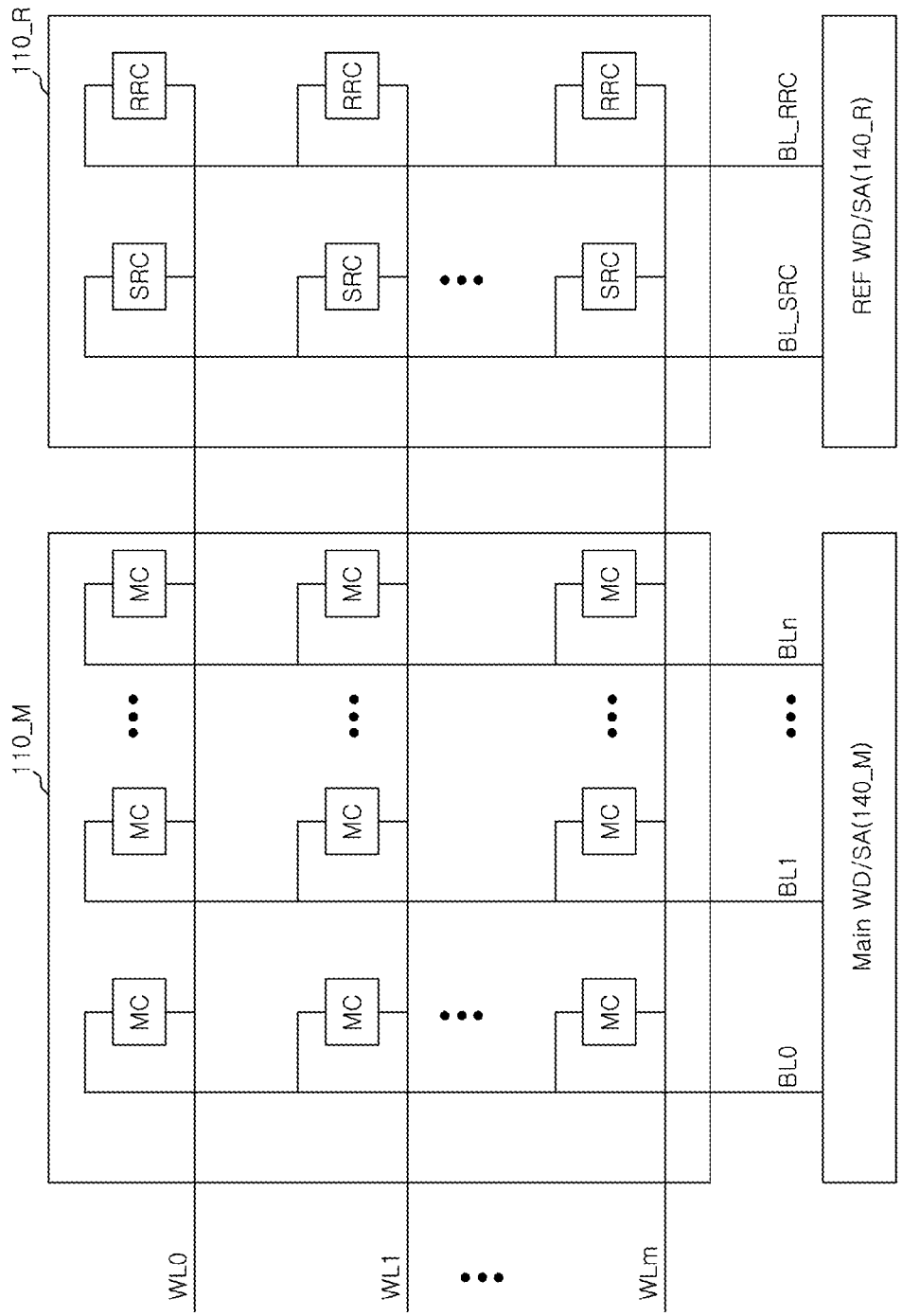
FIG. 7 is a block diagram illustrating the configuration of a reference cell according to an embodiment.

FIG. 7 is a block diagram illustrating the configuration of the reference cell according to an embodiment. As described above, the memory cell array 110 may include the main cell array 110_M and the reference cell array 110_R. The main data read/write circuit 140_M (i.e., Main WD/SA(140_M)) performs a read operation and a program (or write) operation on the main cell array 100_M. The reference data read/write circuit 140_R (i.e., REF WD/SA(140_R)) performs a read operation and a program (or write) operation on the reference cell array 110_R.

The main cell array 110_M may include memory cells MCs arranged at regions where bit lines BL0 to BLn and word lines WL0 to WLm cross each other. The memory cells MC connected to one word line (for example, any one of the word lines WL0 to WLm) may be simultaneously programmed when the corresponding word line is enabled.

The reference cell array 110_R may include set reference cells SRC programmed in a set state (that is, a crystalline state). Furthermore, the reference cell array 110_R may include reset reference cells RRC programmed in a reset state (that is, an amorphous state). One or more of set reference cells SRCs may be connected to each of the word lines. Furthermore, one or more of reset reference cells RRCs may be connected to each of the word lines.

For this reason, the memory cells MCs, the set reference cell SRC, and the reset reference cell RRC connected to one word line (for example, any one of the word lines WL0 to WLm) may be substantially simultaneously programmed when the corresponding word line is enabled. For example, the memory cells MCs may be programmed in a state based on inputted data, the set reference cell SRC may be programmed in a set state, and the reset reference cell RRC may be programmed in a reset state at the same time or substantially the same time. This means that the same resistance drift effect may occur in the memory cells MCs, the set reference cell SRC, and the reset reference cell RRC. Based on resistance changes of the set reference cell SRC and the reset reference cell RRC which are influenced by the same resistance drift effect as the memory cells MCs, a read operation for the memory cells MCs may be performed.

Figure 8:
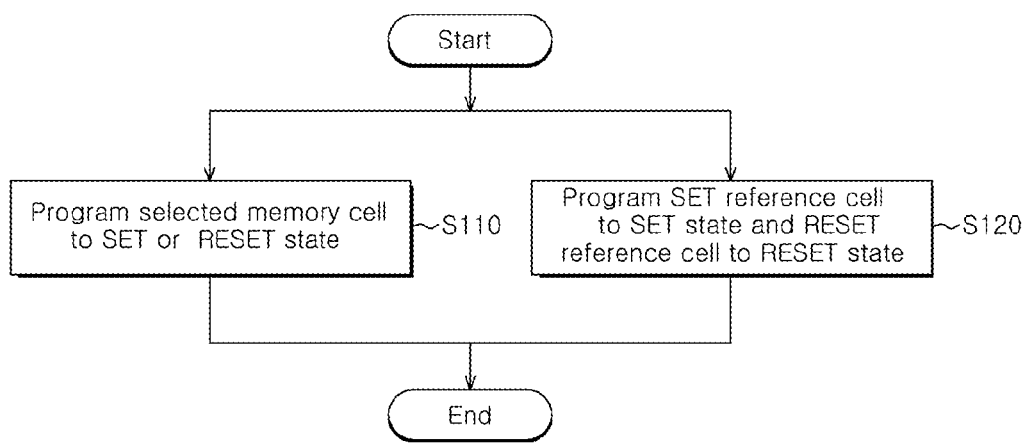
FIG. 8 is a flow chart for explaining a program operation of the variable resistance memory device according to an embodiment.

FIG. 8 is a flow chart for explaining a program operation of the variable resistance memory device according to an embodiment. Hereafter, referring to FIGS. 7 and 8, the program operation of the variable resistance memory device will be described below.

At step S110 (i.e., Program selected memory cell to SET or RESET state), a selected memory cell MC is programmed in any one of the set state and the reset state depending on inputted data. At step S120 (i.e., Program SET reference cell to SET state and RESET reference cell to RESET state), the reference cells SRC and RRC are programmed. That is, the set reference cell SRC is programmed in the set state, and the reset reference cell RRC is programmed in the reset state. The reference cells SRC and RRC are programmed for a pre-read operation included in a read operation.

As described above, memory cells MC, a set reference cell SRC, and a reset reference cell RRC, which are connected to a selected word line, are simultaneously programmed. That is, the program operation for the memory cells MCs connected to the selected word line (step S110) and the program operation for the set reference cell SRC and the reset reference cell RRC connected to the selected word line (step S120) are performed in parallel.

Figure 9:
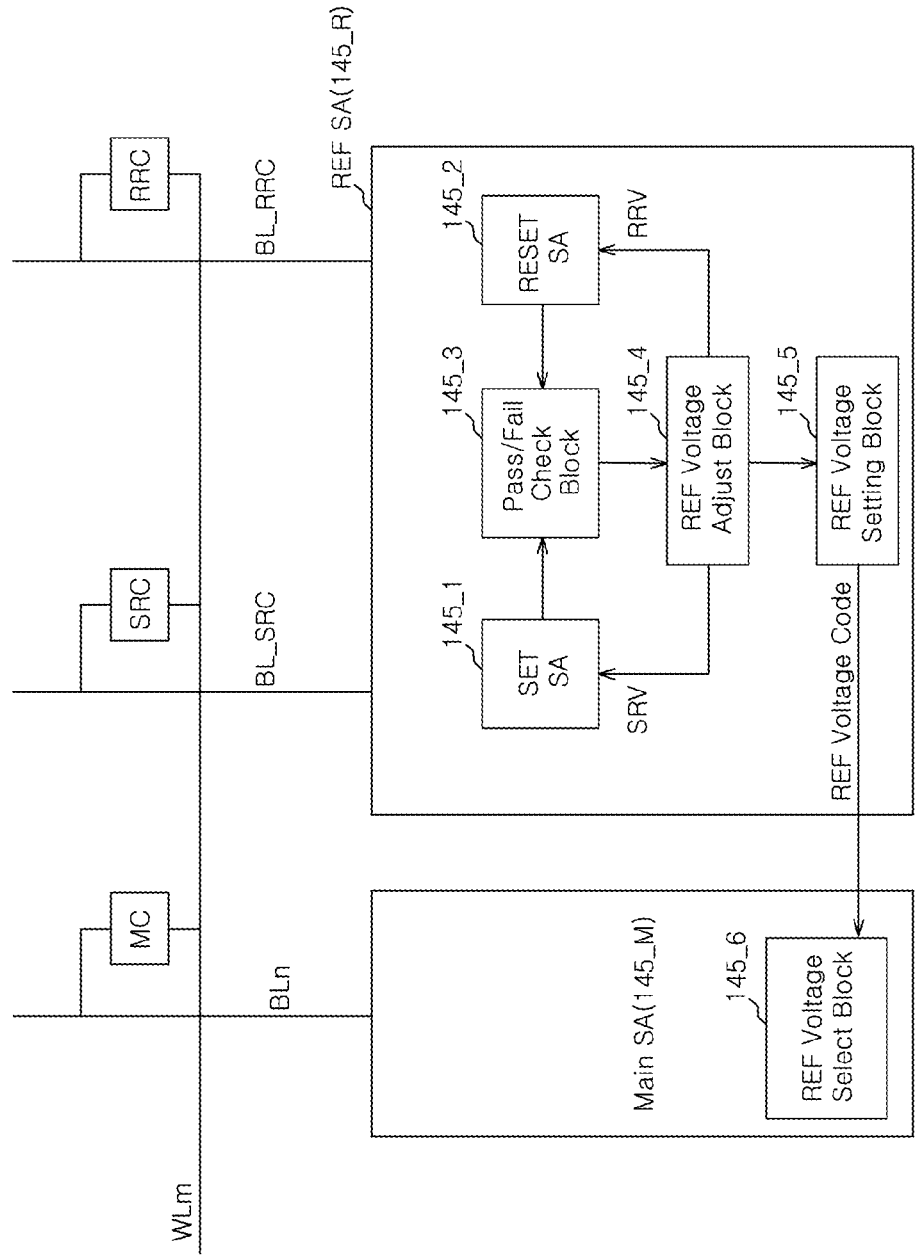
FIG. 9 is a block diagram for explaining a read operation according to an embodiment.

FIG. 9 is a block diagram for explaining a read operation according to an embodiment. Referring to FIG. 9, the main sense amplifier 145_M (i.e., Main SA(145_M)) may include a reference voltage select block 145_6 (i.e., REF Voltage Select Block). The reference sense amplifier 145_R (i.e., REF SA(145_R)) may include a set sense amplifier 145_1 (i.e., SET SA), a reset sense amplifier 145_2 (i.e., RESET SA), a pass/fail check block 145_3, a reference voltage adjust block 145_4 (i.e., REF Voltage Adjust Block), and a reference voltage setting block 145_5 (i.e., REF Voltage Setting Block). The reference sense amplifier 145_R performs a pre-read operation.

The set sense amplifier 145_1 may be configured to perform a read operation for the set reference cell SRC. The set sense amplifier 145_1 may be configured to sense a difference between the voltage of a sensing node (not illustrated) formed according to the state of the set reference cell SRC and the reference voltage provided from the reference voltage adjust block 145_4.

FIG. 9 illustrates that the set sense amplifier 145_1 may be connected to one set reference cell SRC. As illustrated in FIG. 7, however, the set sense amplifier 145_1 may be connected to a plurality of set reference cells SRCs through a bit line BL_SRC, and may perform a read operation on each of the set reference cells SRCs.

The reset sense amplifier 145_2 may be configured to perform a read operation on the reset reference cell RRC. The reset sense amplifier 145_2 may be configured to sense a difference between the voltage of a sensing node (not illustrated) formed according to the state of the reset reference cell RRC and the reference voltage provided from the reference voltage adjust block 145_4.

FIG. 9 illustrates that the reset sense amplifier 145_2 may be connected to one reset reference cell RRC. As illustrated in FIG. 7, however, the reset sense amplifier 145_2 may be connected to a plurality of reset reference cells RRCs through a bit line BL_RRC, and may perform a read operation on each of the reset reference cells RRCs.

The pass/fail check block 145_3 may be configured to control the reference voltage adjust block 145_4 according to the sensing results of the set sense amplifier 145_1 and the reset sense amplifier 145_2. The reference voltage adjust block 145_4 may be configured to vary a set reference voltage SRV provided to the set sense amplifier 145_1 and a reset reference voltage RRV provided to the reset sense amplifier 145_2 according to the control of the pass/fail check block 145_3. Furthermore, the reference voltage adjust block 145_4 may be configured to provide the set reference voltage SRV provided to the set sense amplifier 145_1 and the reset reference voltage RRV provided to the reset sense amplifier 145_2 to the reference voltage setting block 145_5 according to the control of the pass/fail check block 145_3.

When the sensing result of the set sense amplifier 145_1 or the reset sense amplifier 145_2 is a fail, the pass/fail check block 145_3 controls the reference voltage adjust block 145_4 to vary the reference voltages SRV and RRV. For example, when the sensing result of the set sense amplifier 145_1 is a fail, the pass/fail check block 145_3 may control the reference voltage adjust block 145_4 to increase the set reference voltage SRV. When the sensing result of the reset sense amplifier 145_1 is a fail, the pass/fail check block 145_3 may control the reference voltage adjust block 145_4 to decrease the reset reference voltage RRV.

When the sensing result of the set sense amplifier 145_1 is a pass, the pass/fail check block 145_3 controls the reference voltage adjust block 145_4 to provide the set reference voltage SRV, provided to the set sense amplifier 145_1 from the reference voltage adjust block 145_4, to the reference voltage setting block 145_5. When the sensing result of the reset sense amplifier 145_2 is a pass, the pass/fail check block 145_3 controls the reference voltage control block 145_4 to provide the reset reference voltage RRV, provided to the reset sense amplifier 145_2 from the reference voltage adjust block 145_4, to the reference voltage setting block 145_5.

The reference voltage setting block 145_5 may be configured to set a reference voltage to be used for a read operation of the main sense amplifier 145_M. For example, the reference voltage setting block 145_5 may calculate an average of the set reference voltage SRV provided from the reference voltage adjust block 145_4 when the read operation of the set sense amplifier 145_1 is passed and the reset reference voltage RRV provided from the reference voltage adjust block 145_4 when the read operation of the reset sense amplifier 145_2 is passed. The calculated average value is provided to the main sense amplifier 145_M as a code value (i.e., REF Voltage Code) for generating a reference voltage to be used for a read operation of the main sense amplifier 145_M.

The reference voltage select block 145_6 of the main sense amplifier 145_M may be configured to select a reference voltage to be used for a read operation of a selected memory cell MC among voltages provided from a voltage generator (not illustrated), based on the reference voltage code value. As another example, the reference voltage select block 145_6 may vary a voltage provided from the voltage generator (not illustrated) based on the reference voltage code value.

Figure 10:
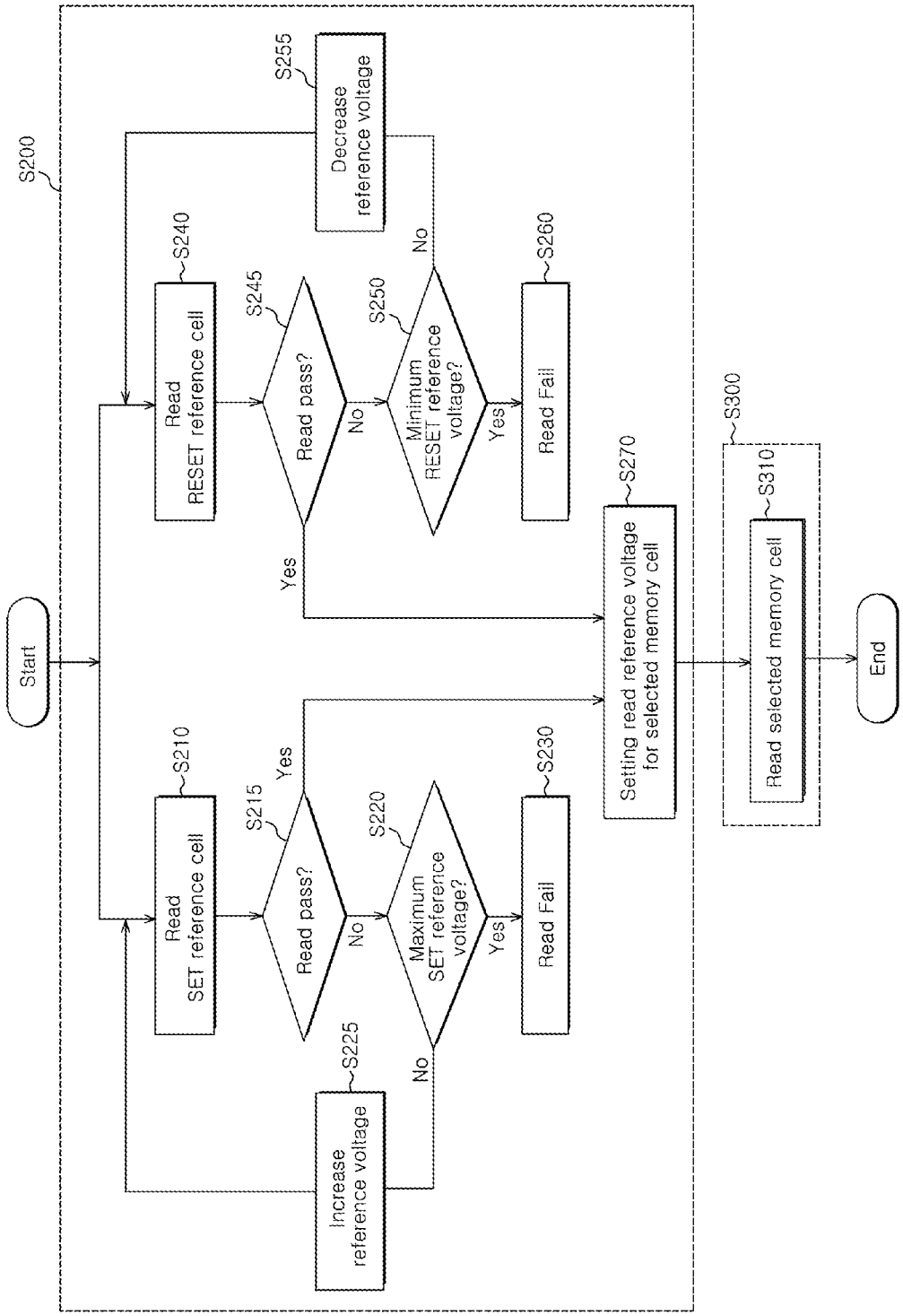
FIG. 10 is a flow chart for explaining the read operation of the variable resistance memory device according to an embodiment.

FIG. 10 is a flow chart for explaining the read operation of the variable resistance memory device according to an embodiment. Hereafter, referring to FIGS. 9 and 10, the read operation of the variable resistance memory device will be described below.

Referring to FIG. 10, the read operation of the variable resistance memory device may include a pre-read operation S200 and a main read operation S300. The pre-read operation S200 may include a read operation for reference cells SRC and RRC. The main read operation S300 may include a read operation for a selected memory cell MC. Through the pre-read operation S200, a reference voltage to be used for the main read operation S300 is set.

At step S210 (i.e., Read SET reference cell), the set sense amplifier 145_1 performs a read operation on a set reference cell SRC connected to a selected word line WLm.

At step S215 (i.e., Read pass), the pass/fail check block 145_3 may determine whether the sensing result of the set sense amplifier 145_1 is a pass or not. When the sensing result of the set sense amplifier 145_1 is a pass (i.e., Yes), the pass/fail check block 145_3 controls the reference voltage adjust block 145_4 to provide the set reference voltage SRV provided to the set sense amplifier 145_1 to the reference voltage setting block 145_5. When the sensing result of the set sense amplifier 145_1 is a pass, the procedure proceeds to step S270. When the sensing result of the set sense amplifier 145_1 is a fail (i.e., No), the pass/fail check block 145_3 controls the reference voltage adjust block 145_4 to provide a set reference voltage SRV higher than the current set reference voltage SRV to the set sense amplifier 145_1.

At step S220 (i.e., Maximum SET reference voltage?), the reference voltage adjust block 145_4 may determine whether the set reference voltage SRV provided to the set sense amplifier 145_1 is the maximum value or not. When the read operation for the set reference cell SRC is a fail (i.e. Yes) even though the set reference voltage SRV was applied as the maximum value, the procedure proceeds to step S230 (i.e., Read Fail), and the pre-read operation S200 is ended as a fail.

At step S225 (i.e., Increase reference voltage), when the set reference voltage SRV is not the maximum value (i.e., No), the reference voltage adjust block 145_4 increases the set reference voltage SRV and provides the increased set reference voltage SRV to the set sense amplifier 145_1. Until the read operation for the set reference cell SRC is passed, the read operation is repeated while the set reference voltage SRV is varied.

At step S240 (i.e., Read REST reference cell), the reset sense amplifier 145_2 may perform a read operation on the reset reference cell RRC connected to the selected word line WLm.

At step S245 (i.e., Read pass), the pass/fail check block 145_3 may determine whether the sensing result of the reset sense amplifier 145_2 is a pass or not. When the sensing result of the reset sense amplifier 145_2 is a pass (i.e., Yes), the pass/fail check block 145_3 controls the reference voltage adjust block 145_4 to provide the reset reference voltage RRV provided to the reset sense amplifier 145_2 to the reference voltage setting block 145_5. When the sensing result of the reset sense amplifier 145_2 is a pass, the procedure proceeds to step S270. When the sensing result of the reset sense amplifier 145_2 is a fail (i.e., No), the pass/fail check block 145_3 controls the reference voltage control block 145_4 to provide a reset reference voltage RRV lower than the current reset reference voltage RRV to the reset sense amplifier 145_2.

At step S250 (i.e., Minimum RESET reference voltage?), the reference voltage adjust block 145_4 may determine whether the reset reference voltage RRV provided to the reset sense amplifier 145_2 is the minimum value or not. When the read operation for the reset reference cell RRC is a fail (i.e., Yes) even though the reset reference voltage RRV was applied as the minimum value, the procedure proceeds to step S260 (i.e., Read fail), and the pre-read operation S200 is ended as a read fail.

At step S255 (i.e., Decrease reference voltage), when the reset reference voltage RRV is not the minimum value (i.e., No), the reference voltage adjust block 145_4 decreases the reset reference voltage RRV, and provides the decreased reset reference voltage RRV to the reset sense amplifier 145_2. Until the read operation for the reset reference cell RRC is passed, the read operation is repeated while the reset reference voltage RRV is varied.

For example, the read operation for the set reference cell SRC and the read operation for the reset reference cell RRC may be performed in parallel. For another example, the read operation for the set reference cell SRC and the read operation for the reset reference cell RRC may be sequentially performed.

At step S270 (i.e., Setting read reference voltage for selected memory cell), the set reference voltage SRV when the read operation for the set reference cell SRC was passed (i.e., Yes) and the reset reference voltage RRV when the read operation for the reset reference cell RRC was passed (i.e., Yes) are used to set the reference voltage to be used for the read operation of the selected memory cell MC (i.e., S310). For example, an average value (or intermediate value) of the set reference voltage SRV when the read operation for the set reference cell SRC was passed and the reset reference voltage RRV when the read operation for the reset reference cell RRC was passed is used as the reference voltage to be used for the read operation for the selected memory cell MC.

After the pre-read operation S200 for setting the reference voltage to be used for the read operation of the selected memory cell MC through the read operations for the set reference cell SRC and the reset reference cell RRC is completed, the main read operation S300 for the selected memory cell MC may be performed. At step S310 (i.e., Read selected memory cell), the main sense amplifier 145_M performs a read operation for the selected memory cell connected to the same word line as the word line connected to the set reference cell SRC and the reset reference cell RRC. The read operation for the selected memory cell MC may be performed in the same manner as a general read operation, except that the read operation may be performed using the reference voltage set through the pre-read operation S200.

Figure 11:
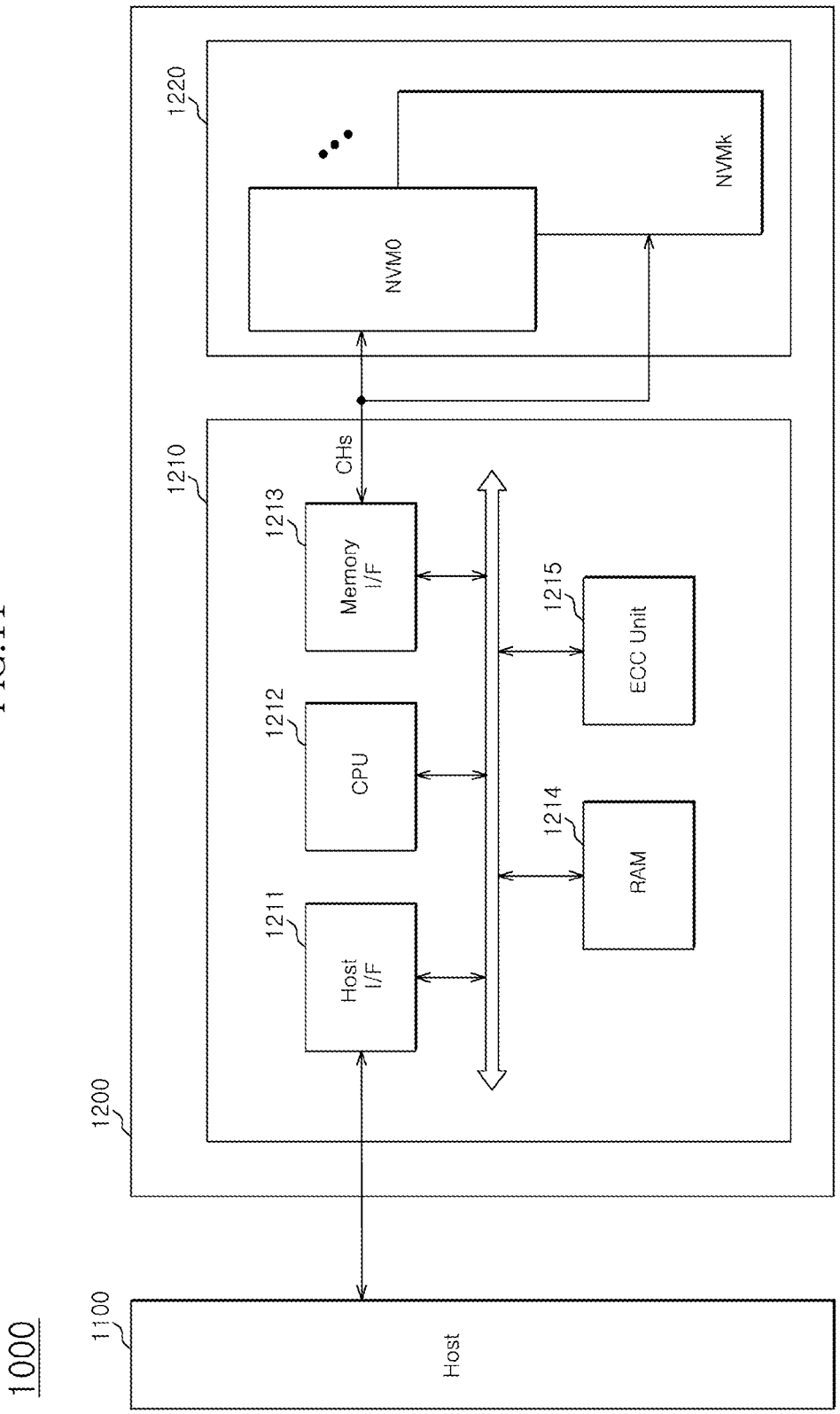
FIG. 11 is a block diagram illustrating a data processing system including the variable resistance memory device according to an embodiment.

FIG. 11 is a block diagram illustrating a data processing system including the variable resistance memory device according to an embodiment. Referring to FIG. 11, the data processing system 1000 may include a host 1100 and a data storage device 1200. The data storage device 1200 may include a controller 1210 and a data storage medium 1220. The data storage device 1200 may be connected to the host 1100 such as a desktop computer, a notebook computer, a digital camera, a mobile phone, an MP3 player, a game machine or the like. The data storage device 1200 is also referred to as a memory system.

The controller 1210 may be coupled to the host 1100 and the data storage medium 1220. The controller 1210 may be configured to access the data storage medium 1220 in response to a request from the host 1100. For example, the controller 1210 may be configured to control a read, program, or erase operation of the data storage medium 1220. The controller 1210 may be configured to drive firmware for controlling the data storage medium 1220.

The controller 1210 may include well-known components such as a host interface 1211, a central processing unit (CPU) 1212, a memory interface 1213, a RAM 1214, and an error correction code (ECC) unit 1215.

The CPU 1212 may be configured to control overall operations of the controller 1210 in response to a request of the host. The RAM 1214 may be used as a working memory of the CPU 1212. The RAM 1214 may temporarily store data read from the data storage medium 1220 or data provided from the host 1100.

The host interface 1211 may be configured to interface the host 1100 and the controller 1210. For example, the host interface 1211 may be configured to communicate with the host 1100 through one of a USB (Universal Serial Bus) protocol, a MMC (Multimedia Card) protocol, a PCI (Peripheral Component Interconnection) protocol, a PCI-E (PCI-Express) protocol, a PATA (Parallel Advanced Technology Attachment) protocol, a SATA (Serial ATA) protocol, an SCSI (Small Computer System Interface) protocol, and an IDE (Integrated Drive Electronics) protocol.

The memory interface 1213 may be configured to interface the controller 1210 and the data storage medium 1220. The memory interface 1213 may be configured to provide a command and address to the data storage medium 1220. Furthermore, the memory interface 1213 may be configured to exchange data with the data storage medium 1220.

The data storage medium 1220 may be configured with the variable resistance memory device 100 of FIG. 1 according to an embodiment. The data storage medium 1220 may include a plurality of nonvolatile memory devices NVM0 to NVMk. As the data storage medium 1220 may be configured with the variable resistance memory device 100 according to an embodiment, the reliability of the data storage device 1200 may be improved.

The ECC unit 1215 may be configured to detect an error of the data read from the data storage medium 1220. Furthermore, the ECC unit 1215 may be configured to correct the detected error, when the detected error falls within a correction range. Meanwhile, the ECC unit 1215 may be provided inside or outside the controller 1210 depending on the memory system 1000.

The controller 1210 and the data storage medium 1220 may be integrated to form a solid state drive (SSD).

As another example, the controller 1210 and the data storage medium 1220 may be integrated into one semiconductor device to form a memory card. For example, the controller 1210 and the data storage medium 1220 may be integrated into one semiconductor device to form a PCMCIA (personal computer memory card international association) card, a CF (compact flash) card, a smart media card, a memory stick, a multi-media card (MMC, RS-MMC, or MMC-micro), an SD (secure digital) card (SD, Mini-SD, or Micro-SD), or a UFS (universal flash storage) card.

As another example, the controller 1210 or the data storage medium 1220 may be mounted in various types of packages. For example, the controller 1210 or the data storage medium 1220 may be packaged and mounted according to various methods such as POP (package on package), ball grid arrays (BGAs), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat package (MQFP), thin quad flat package (TQFP), small outline IC (SOIC), shrink small outline package (SSOP), thin small outline package (TSOP), thin quad flat package (TQFP), system in package (SIP), multi chip package (MCP), wafer-level fabricated package (WFP), and wafer-level processed stack package (WSP).

Figure 12:
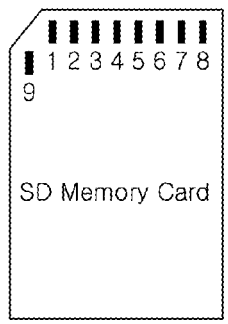
FIG. 12 illustrates a memory card including the nonvolatile memory device according to an embodiment.

FIG. 12 illustrates a memory card including the nonvolatile memory device according to an embodiment. FIG. 12 illustrates the exterior of an SD (secure digital) card among memory cards.

Referring to FIG. 12, the SD card may include one command pin (for example, second pin), one clock pin (for example, fifth pin), four data pins (for example, first, seventh, eighth, and ninth pins), and three power supply pins (for example, third, fourth, and sixth pins).

Through the command pin (second pin), a command and a response signal are transmitted. In general, the command is transmitted to the SD card from the host, and the response signal is transmitted to the host from the SD card.

The data pins (first, seventh, eighth, and ninth pins) are divided into receive (Rx) pins for receiving data transmitted from the host and transmit (Tx) pins for transmitting data to the host. The Rx pins and the Tx pins, respectively, form a pair to transmit differential signals.

The SD card may include the variable resistance memory device 100 of FIG. 1 according to an embodiment and a controller for controlling the variable resistance memory device. The controller included in the SD card may have the same configuration and function as the controller 1210 described with reference to FIG. 11.

Figure 13:
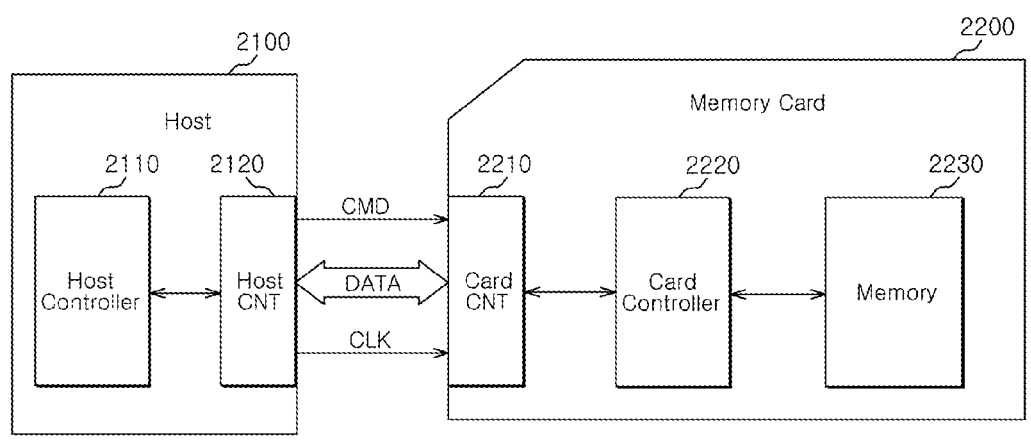
FIG. 13 is a block diagram illustrating the internal configuration of the memory card illustrated in FIG. 12 and the connection relation between the memory card and a host.

FIG. 13 is a block diagram illustrating the internal configuration of the memory card illustrated in FIG. 12 and the connection relation between the memory card and a host. Referring to FIG. 13, the data processing system 2000 may include a host 2100 and a memory card 2200. The host 2100 may include a host controller 2110 and a host connection unit 2120. The memory card 2200 may include a card connection unit 2210, a card controller 2220, and a memory device 2230.

The host connection unit 2120 and the card connection unit 2210 may include a plurality of pins. The pins may include a command pin, a clock pin, a data pin, and a power supply pin. The number of pins may differ depending on the type of the memory card 2200.

The host 2100 may store data in the memory card 2200 or read data stored in the memory card 2200.

The host controller 2110 may transmit a write command CMD, a clock signal CLK generated from a clock generator (not illustrated) inside the host 2100, and data DATA to the memory card 2200 through the host connection unit 2120. The card controller 2220 operates in response to the write command received through the card connection unit 2210. The card controller 2220 may store the received data DATA in the memory device 2230, using a clock signal generated from a clock generator (not illustrated) inside the card controller 2220, according to the received clock signal CLK.

The host controller 2110 may transmit a read command CMD and the clock signal CLK generated from the clock generator inside the host 2100 to the memory card 2200 through the host connection unit 2120. The card controller 2220 may operate in response to the read command received through the card connection unit 2210. The card controller 2220 may read data from the memory device 2230 using the clock signal generated from the clock generator inside the card controller 2220, according to the received clock signal CLK, and transmit the read data to the host controller 2110.

Figure 14:
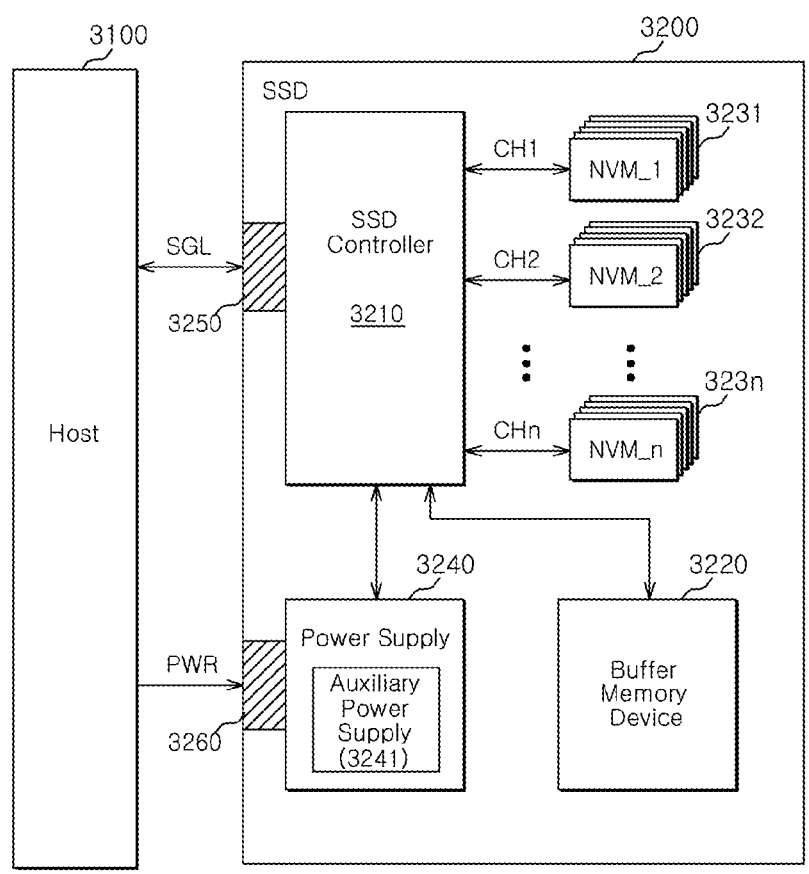
FIG. 14 is a block diagram illustrating an SSD including the variable resistance memory device according to an embodiment.

FIG. 14 is a block diagram illustrating an SSD including the variable resistance memory device according to an embodiment. Referring to FIG. 14, a data processing system 3000 may include a host 3100 and an SSD 3200.

The SSD 3200 may include an SSD controller 3210, a buffer memory device 3220, a plurality of G memory devices 3231 to 323n, a power supply 3240, a signal connector 3250, and a power connector 3260.

The SSD 3200 may operate in response to a request of the host device 3100. That is, the SSD controller 3210 may be configured to access the variable resistance memory devices 3231 to 323n in response to a request from the host 3100. For example, the SSD controller 3210 may be configured to control read, program, and erase operations of the variable resistance memory devices 3231 to 323n.

The buffer memory device 3220 may be configured to temporarily store data which are to be stored in the variable resistance memory devices 3231 to 323n. Furthermore, the buffer memory device 3220 may be configured to temporarily store data read from the variable resistance memory devices 3231 to 323n. The data temporarily stored in the buffer memory device 3220 are transmitted to the host 3100 or the variable resistance memory devices 3231 to 323n, according to the control of the SSD controller 3210.

The variable resistance memory devices 3231 to 323n are used as storage media of the SSD 3200. Each of the variable resistance memory devices 3231 to 323n may include the variable resistance memory device 100 of FIG. 1 according to an embodiment. Therefore, the reliability of the SSD 3200 may be improved.

The variable resistance memory devices 3231 to 323n are connected to the SSD controller 3210 through a plurality of channels CH1 to CHn, respectively. One channel may be connected to one or more variable resistance memory devices. The variable resistance memory devices connected to one channel may be connected to the same signal bus and data bus.

The power supply 3240 may be configured to provide power PWR inputted through the power connector 3260 into the SSD 3200. The power supply 3240 may include an auxiliary power supply 3241. The auxiliary power supply 3241 may be configured to supply power to normally terminate the SSD 3200, when sudden power off occurs. The auxiliary power supply 3241 may include super capacitors capable of storing the power PWR.

The SSD controller 3210 may be configured to exchange signals SGL with the host 3100 through the signal connector 3250. Here, the signals SGL may include commands, addresses, data and the like. The signal connector 3250 may include a connector such as PATA (Parallel Advanced Technology Attachment), SATA (Serial Advanced Technology Attachment), SCSI (Small Computer System Interface), or SAS (Serial SCSI), according to the interface method between the host 3100 and the SSD 3200.

Figure 15:
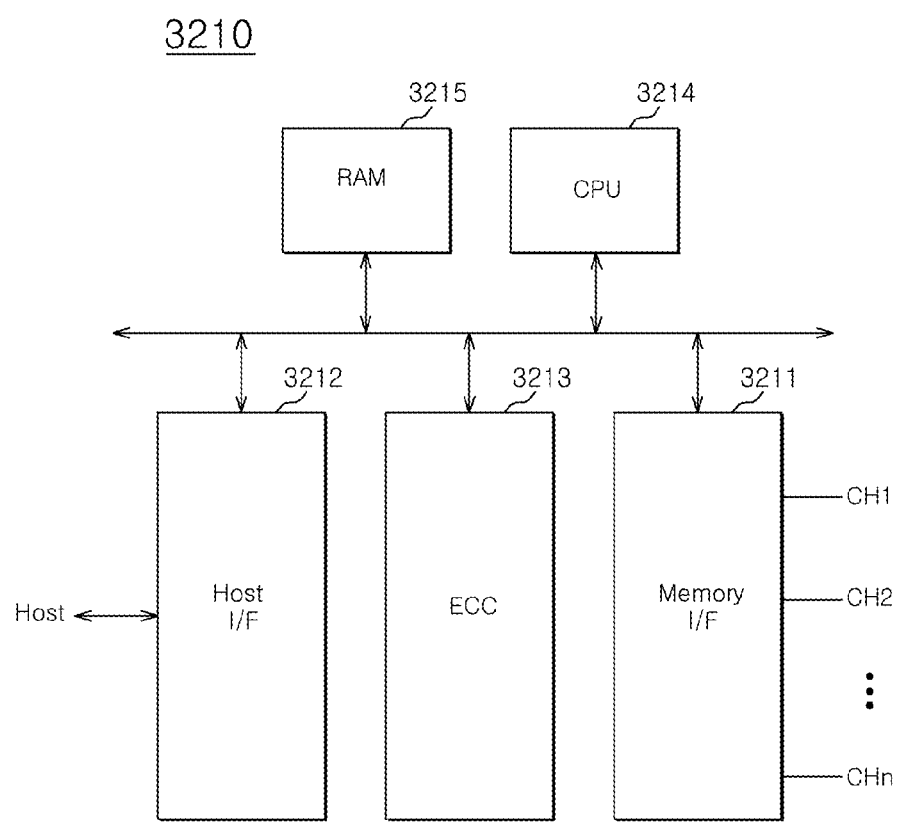
FIG. 15 is a block diagram illustrating an SSD controller of FIG. 14.

FIG. 15 is a block diagram illustrating the SSD controller of FIG. 14. Referring to FIG. 11, the SSD controller 3210 may include a memory interface 3211, a host interface 3212, an ECC unit 3213, a CPU 3214, and a RAM 3215.

The memory interface 3211 may be configured to provide a command and address to the variable resistance memory devices 3231 to 323n. Furthermore, the memory interface 3211 may be configured to exchange data with the nonvolatile memory devices 3231 to 323n. The memory interface 3211 may scatter data transmitted from the buffer memory device 3220 over the respective channels CH1 to CHn, according to the control of the CPU 3214. Furthermore, the memory interface 3211 may transmit data read from the variable resistance memory devices 3231 to 323n to the buffer memory device 3220, according to the control of the CPU 3214.

The host interface 3212 may be configured to provide an interface with the SSD 3200 in response to the protocol of the host 3100. For example, the host interface 3212 may be configured to communicate with the host 3100 through one of PATA (Parallel Advanced Technology Attachment), SATA (Serial Advanced Technology Attachment), SCSI (Small Computer System Interface), SAS (Serial SCSI) protocols. Furthermore, the host interface 3212 may perform a disk emulation function of supporting the host 3100 to recognize the SSD 3200 as a hard disk drive (HDD).

The ECC unit 3213 may be configured to generate parity bits based on the data transmitted to the variable resistance memory devices 3231 to 323n. The generated parity bits may be stored in spare areas of the variable resistance memory devices 3231 to 323n. The ECC unit 3213 may be configured to detect an error of data read from the nonvolatile memory devices 3231 to 323n. When the detected error falls within a correction range, the ECC unit 3213 may correct the detected error.

The CPU 3214 may be configured to analyze and process a signal SGL inputted from the host 3100. The CPU 3214 controls overall operations of the SSD controller 3210 in response to a request of the host 3100. The CPU 3214 controls the operations of the buffer memory device 3220 and the variable resistance memory devices 3231 to 323n according to firmware for driving the SSD 3200. The RAM 3215 is used as a working memory device for driving the firmware.

Figure 16:
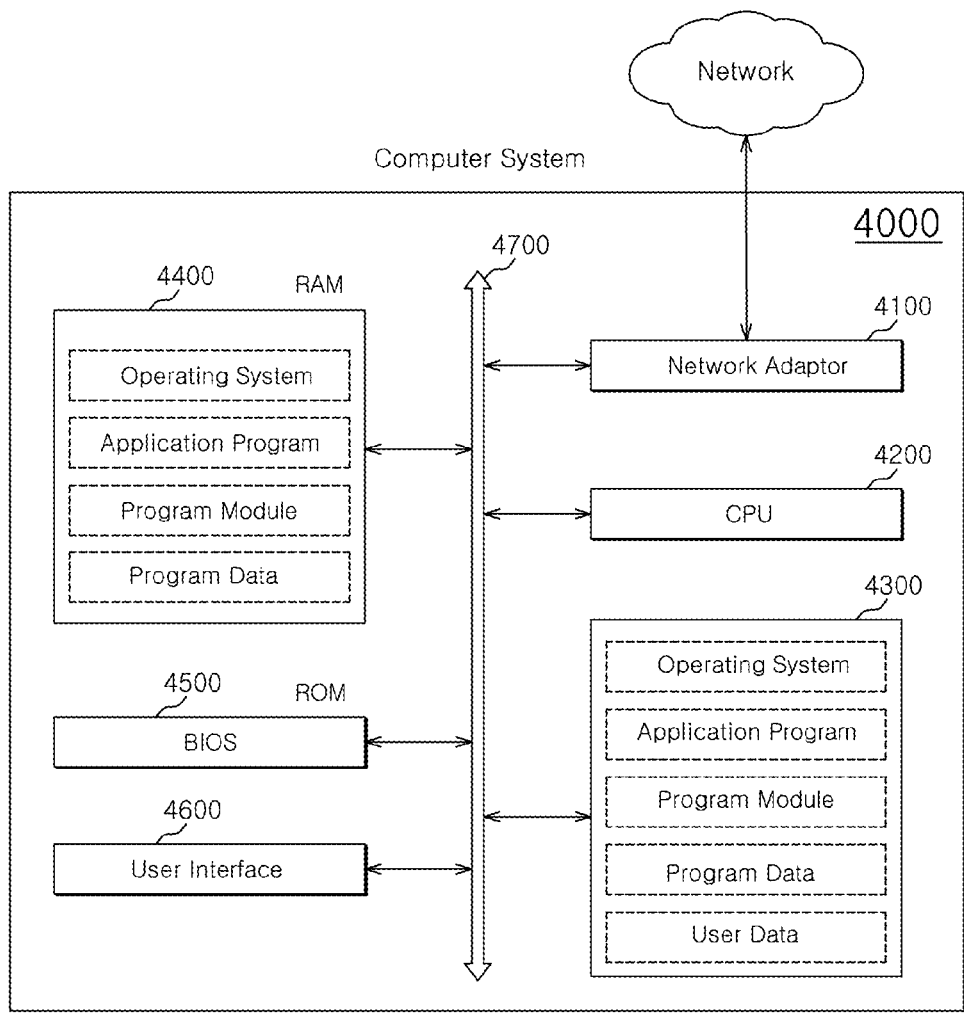
FIG. 16 is a block diagram illustrating a computer system in which a data storage device having the variable resistance memory device according to an embodiment is mounted.

FIG. 16 is a block diagram illustrating a computer system in which a data storage device having the variable resistance memory device according to an embodiment that may be mounted. Referring to FIG. 16, the computer system 4000 may include a network adapter 4100, a CPU 4200, a data storage device 4300, a RAM 4400, a ROM 4500, and a user interface 4600, which are electrically connected to the system bus 4700. Here, the data storage device 4300 may include the data storage device 1200 illustrated in FIG. 11 or the SSD 3200 illustrated in FIG. 14.

The network adapter 4100 may be configured to provide an interfaces between the computer system 4000 and external networks. The CPU 4200 may be configured to perform overall arithmetic operations for driving an operating system or application programs staying in the RAM 4400.

The data storage device 4300 may be configured to store overall data required by the computer system 4000. For example, the operating system for driving the computer system 4000, application programs, various program modules, program data, and user data may be stored in the data storage device 4300.

The RAM 4400 may be used as a working memory device of the computer system 4000. During booting, the operating system, application programs, various program modules, which are read from the data storage device 4300, and program data required for driving the programs are loaded into the RAM 4400. The ROM 4500 stores a basic input/output system (BIOS) which is enabled before the operating system is driven. Through the user interface 4600, information exchange is performed between the computer system 4000 and a user.

Although not illustrated in the drawing, the computer system 4000 may further include a battery, application chipsets, a camera image processor (CIP) and the like.

According to the embodiments, it is possible to improve the sensing margin of the variable resistance memory cell, thereby improving the reliability of the variable resistance memory device.

While various embodiments have been described above, it will be understood to those skilled in the art that the embodiments described are by way of example only. Accordingly, the variable resistance memory device described herein should not be limited based on the described embodiments.

What is claimed is:

1. An operating method of a variable resistance memory device, comprising:
   a pre-read step comprising the steps of:
      reading a first reference cell by comparing a voltage generated according to data stored in the first reference cell with a first reference voltage;
      reading a second reference cell by comparing a voltage generated according to data stored in the second reference cell with a second reference voltage; and
      setting a value between the first and second reference voltages as a third reference voltage; and a main read step of reading a selected memory cell by comparing a voltage generated according to data stored in the selected memory cell with the third reference voltage.

2. The operating method according to claim 1, wherein the pre-read step comprises a step of varying the first reference voltage until the read operation for the first reference cell is passed, and a step of varying the second reference voltage until the read operation for the second reference cell is passed.

3. The operating method according to claim 2, wherein the step of varying the first reference voltage comprises the step of increasing the first reference voltage when the read operation for the first reference cell is a fail, and
the step of reading the first reference cell using the increased first reference voltage is performed again.

4. The operating method according to claim 3, wherein the first reference cell comprises a set reference cell.

5. The operating method according to claim 3, wherein the step of increasing the first reference voltage and the step of reading the first reference cell are repeated until the read operation is passed.

6. The operating method according to claim 2, wherein the step of varying the second reference voltage comprises the step of decreasing the second reference voltage when the read operation for the second reference cell is a fail, and
the step of reading the second reference cell using the decreased second reference voltage is performed again.

7. The operating method according to claim 6, wherein the first reference cell comprises a reset reference cell.

8. The operating method according to claim 6, wherein the step of decreasing the second reference voltage and the step of reading the second reference cell are repeated until the read operation is passed.

9. The operating method according to claim 2, wherein the step of setting the third reference voltage comprises the steps of:
calculating an average of the first reference voltage used when the read operation for the first reference cell is passed and the second reference voltage used when the read operation for the second reference cell is passed; and
setting the calculated average as the third reference voltage.

10. The operating method according to claim 1, wherein the main read step comprises the step of sensing a difference between the third reference voltage and a voltage of a sensing node formed according to a resistance state of the selected memory cell.

11. The operating method according to claim 1, further comprising the step of programming the first reference cell into a first state and programming the second reference cell into a second state having a higher resistance than the first state.

12. The operating method according to claim 11, wherein the first and second reference cells are substantially simultaneously programmed when the selected memory cell is programmed.

13. The operating method according to claim 1, wherein the steps of reading a first reference cell using a first reference voltage and reading a second reference cell using a second reference voltage are performed in parallel.

14. A variable resistance memory device comprising:
a memory cell arranged at a region where a word line and a bit line cross each other;
a first reference cell and a second reference cell connected to the word line;
a reference sense amplifier configured to perform a read operation for the first and second reference cells, and generate a third reference voltage generation code based on a first reference voltage used for the read operation for the first reference cell and a second reference voltage used for the read operation for the second reference cell; and
a main sense amplifier configured to select a third reference voltage according to the third reference voltage generation code, and perform a read operation for the memory cell using the selected third reference voltage,
wherein the first reference voltage is used for comparison with a voltage generated according to data stored in the first reference cell, the second reference voltage is used for comparison with a voltage generated according to data stored in the second reference cell and the selected third reference voltage is used for comparison with a voltage generated according to data stored in the memory cell.

15. The variable resistance memory device according to claim 14, wherein the reference sense amplifier comprises:
a first reference sense amplifier configured to perform the read operation for the first reference cell;
a second reference sense amplifier configured to perform the read operation for the second reference cell;
a pass/fail check block configured to determine sensing results of the first and second reference sense amplifiers;
a reference voltage adjust block configured to vary the first reference voltage provided to the first reference sense amplifier and the second reference voltage provided to the second reference sense amplifier according to the sensing result of the pass/fail check block; and
a reference voltage setting block configured to generate the third reference voltage generation code based on the first and second reference voltages provided from the reference voltage adjust block.

16. The variable resistance memory device according to claim 15, wherein the reference voltage adjust block is configured to increase the first reference voltage when the sensing result of the first reference sense amplifier is a fail, and provide the increased first reference voltage to the first reference sense amplifier.

17. The variable resistance memory device according to claim 16, wherein the first reference cell comprises a set reference cell.

18. The variable resistance memory device according to claim 16, wherein the first reference sense amplifier is configured to perform the read operation for the first reference cell again, using the increased first reference voltage.

19. The variable resistance memory device according to claim 18, wherein the first reference sense amplifier, the pass/fail check block, and the reference voltage adjust block repeat corresponding operations until the read operation for the first reference cell is passed.

20. The variable resistance memory device according to claim 16, wherein the reference voltage adjust block provides the first reference voltage to the reference voltage setting block when the sensing result of the first reference sensing amplifier is a pass.

* * * * *